(12) United States Patent
Tischler

(10) Patent No.: US 8,063,467 B2
(45) Date of Patent: Nov. 22, 2011

(54) SEMICONDUCTOR STRUCTURE AND METHOD OF MANUFACTURE

(75) Inventor: Michael Albert Tischler, Phoenix, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 371 days.

(21) Appl. No.: 12/330,748

(22) Filed: Dec. 9, 2008

(65) Prior Publication Data

US 2009/0146244 A1      Jun. 11, 2009

Related U.S. Application Data

(60) Provisional application No. 61/012,874, filed on Dec. 11, 2007.

(51) Int. Cl.
*H01L 29/02* (2006.01)

(52) U.S. Cl. ........ 257/496; 257/487; 257/499; 257/506; 257/E21.545

(58) Field of Classification Search ........................ None
See application file for complete search history.

(56) References Cited

U.S. PATENT DOCUMENTS 6,274,920 B1 *   8/2001   Park et al. ..................... 257/531

* cited by examiner

*Primary Examiner* — Evan Pert
*Assistant Examiner* — Scott R Wilson
(74) *Attorney, Agent, or Firm* — Cool Patent, P.C.; Kenneth J. Cool

(57) ABSTRACT

In various embodiments, semiconductor structures and methods to manufacture these structures are disclosed. In one embodiment, a method includes removing a portion of a semiconductor material to form a first protrusion and a cavity having a boundary that is below a surface of the semiconductor material, wherein the first protrusion extends from the boundary of the cavity. The method further includes forming a non-conformal material over a first portion of the first protrusion using an angled deposition of the non-conformal material, wherein the angle of deposition of the non-conformal material is non-perpendicular to the surface of the semiconductor material. Other embodiments are described and claimed.

20 Claims, 5 Drawing Sheets

SEMICONDUCTOR STRUCTURE AND METHOD OF MANUFACTURE

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency ("RF") applications, integrated passive devices may be formed using semiconductor processing technology or it may be contemplated to integrate passive devices such as inductors and/or capacitors together with active devices such as transistors using conductive silicon substrates. However, passive devices may have relatively low quality factors ("Qs") when these passive devices are formed on, or in relatively close proximity to, the conductive silicon substrate. In addition, due to parasitic capacitive coupling between these passive devices and the conductive silicon substrate, the frequency of operation of the integrated devices is reduced. Electrically conductive interconnects or busses may be used to electrically couple different devices within the die and external to the die. The frequency of operation may also be reduced by parasitic capacitive coupling between the interconnects and the conductive silicon substrate.

Further, it may be contemplated to physically and electrically isolate regions of a semiconductor substrate from each other. Additionally, some semiconductor devices, such as power transistors, provide relatively high output power, which may be utilized in some RF, industrial, and medical applications. Power transistor designers are continually seeking ways to efficiently increase output power by varying the output voltage and current characteristics of a power transistor. For example, it may be contemplated to have a power transistor that has an increased breakdown voltage to enable the power transistor to operate at a relatively higher voltage and provide a relatively higher output power.

Accordingly, it is contemplated to have semiconductor structures, and methods to make these structures, that may provide for reduced parasitic capacitances, relatively higher frequencies of operation, relatively higher breakdown voltages, relatively higher quality factor passive devices, increased isolation, or combinations thereof.

Figure 1:
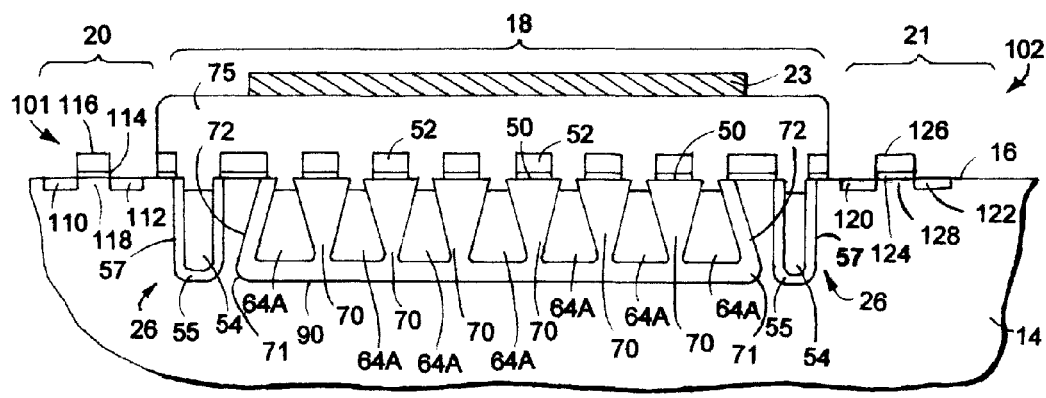
FIG. 1 is a cross-sectional view of a semiconductor structure in accordance with an embodiment of the present invention.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements.

DETAILED DESCRIPTION

In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 is a cross-sectional view of a semiconductor structure 100 that illustrates a dielectric platform ("DP") 18, active regions 20 and 21, and an electrically conductive material 23. Dielectric platform 18 may be referred to as a dielectric structure or a dielectric region. Active regions 20 and 21 may also be referred to as active areas, active area regions or portions of active areas since active devices, or portions of active devices, are formed in active areas 20 and 21.

Dielectric platform 18 of semiconductor structure 100 comprises a plurality of dielectric structures 70 such as, for example, pillars or columns 70 formed in a substrate 14 having a boundary or top surface 16. Although not shown, substrate 14 also has an opposing boundary or bottom surface that is parallel to, or substantially parallel to, top surface 16. In other embodiments of the present invention, dielectric structures 70 may be elongated walls and may also be referred to as partitions, protrusions or projections. Dielectric structures 70 may comprise silicon dioxide and may be referred to as vertical structures. Dielectric structures 70 may be part of a dielectric layer or region 71. For example, as is discussed below, in some embodiments, a thermal oxidation may be performed to convert a portion of substrate 14 to silicon dioxide, thereby forming silicon dioxide layer or region 71 which includes structures 70. In addition to dielectric region 71, dielectric platform 18 shown in FIG. 1 includes a capping structure 75, a sealed cavity 64A, dielectric layers 50 and 52, and a termination structure 26 that comprises a trench 54 and a dielectric layer 55.

A cavity 64 (FIGS. 4 and 5) having a floor 66 (FIG. 4) extends from surface 16 into substrate 14. Dielectric pillars 70 extend from floor 66 towards surface 16. Cavity 64 may also be referred to as a void, a gap, an air gap, an opening, a trench, an empty region, an empty space, or the like. In addition, as described herein, in some embodiments of the present invention, cavity 64 may be enclosed, capped, covered, or sealed, and also may be hermetically sealed to prevent any contamination from undesirable particles, gasses or moisture that may propagate into, or get trapped in cavity 64. When capped, the cavity is identified by reference number 64A and may be referred to as a sealed cavity, a sealed gap, a sealed void, a closed cell, or a closed cell void. In some embodiments, cavity 64A is evacuated to a pressure less than atmospheric pressure. In other words, the pressure in cavity 64A is below atmospheric pressure. As an example, the pressure in cavity 64A may range from approximately 0.1 Torr to approximately 10 Torr. The type of substance or material within cavity 64A is not a limitation of the present invention. For example, cavity 64A may contain a gas, a fluid, or a solid matter.

Capping structure 75 is formed over dielectric pillars 70 and cavity 64 and seals cavity 64 to form a sealed cavity 64A. Capping structure 75 is also referred to as a capping layer, and may comprise, for example, silicon dioxide ($SiO_2$), and has a thickness ranging from about 1000 Angstroms ("Å") to about 4 microns ("μm"). In some embodiments, due to the relatively small openings between the upper portions of pillars 70, capping structure 75 may enter into a portion of cavity 64A or a region between the upper portions of adjacent pillars 70, but not fill cavity 64A due in part to the relatively small size of the openings between the upper portions of pillars 70. An optional conformal sealing layer (not shown in FIG. 1) such as, for example, silicon nitride ($Si_3N_4$), may be formed on silicon dioxide layer 75 to hermetically seal cavity 64A. In other words, the optional conformal silicon nitride layer may fill in any openings or cracks in the silicon dioxide capping layer 75, and in general prevent the propagation of gases or moisture into cavity 64A. In some embodiments, cavity 64A may be multiple cavities that are physically isolated from each other. Accordingly, if capping structure 75 or isolated dielectric structures 70 experience a rupture or fracture, this rupture or fracture is contained in a limited area so that any contamination external to the dielectric platform 18 that propagates into cavities 64A through the rupture or fracture may be contained in a limited area of dielectric platform 18 due to the physical isolation of the multiple cavities from each other. For example, a closed cell configuration would prevent a fracture or rupture from introducing ambient gas into all of the multiple cavities of dielectric platform 18.

An optional dielectric termination structure 26 comprising a trench 54 and a dielectric layer 55 may be formed in substrate 14. Termination structure 26 may also be referred to as a dielectric structure. In some embodiments dielectric layer 55 may comprise silicon dioxide. Dielectric termination structure 26 may be part of dielectric platform 18 or may be laterally spaced apart from dielectric platform 18. In other embodiments, trench 54 may be filled with one or more dielectric materials (not shown) such as, for example, an oxide, a nitride, or undoped polysilicon. Termination structure 26 has sidewalls 57 that are perpendicular, or substantially perpendicular, to the upper surface 16 of substrate 14. Termination structure 26 may serve as termination for field lines such as, for example, equipotential lines, during depletion of active devices formed in active regions 20 and 21. Thus, as is discussed further below, equipotential lines impinge on dielectric sidewalls 57. In other words, termination structure 26 may provide termination for equipotential lines from an electric field in an active area formed adjacent to termination structure 26. It may be desirable for sidewalls 57 to be straight and smooth so that the equipotential lines are substantially perpendicular to sidewalls 57 so that a condition that is referred to as planar breakdown is achieved where equipotential lines terminate at a perpendicular angle, or a substantially perpendicular angle, to the oxide sidewalls 57. Equipotential lines that impinge on sidewalls 57 at an angle that is not perpendicular to sidewalls 57 may decrease the breakdown voltage of active devices formed in active region 20, active region 21, or both.

As is discussed below, active devices, or portions of active devices, are formed in or from substrate 14. Substrate 14 may comprise a semiconductor material and active regions 20 and 21 may comprise semiconductor material 14. In some embodiments, semiconductor material 14 may comprise silicon and may be referred to as a device layer or an active layer. Further, in some embodiments, substrate 14 may include one or more epitaxial layers. Semiconductor layer 14 may include an active area in which active devices, such as, for example, transistors or diodes, or portions of active devices, may be subsequently formed. In some embodiments, semiconductor material 14 may be formed on a substrate comprised of the same or a different material. In one example, semiconductor material 14 is silicon which is epitaxially grown on a silicon substrate. A substrate may mean a semiconductor material, one or more epitaxial layers formed on a semiconductor material, a semiconductor material disposed on an insulating material, or the like. Substrate 14 may also be referred to as a semiconductor substrate. Active regions 20 and 21 may be used as an active area where active devices, such as, for example, transistors or diodes, or portions of active devices, may be subsequently formed. Active devices may be formed in active regions 20 and 21 using conventional complementary metal oxide semiconductor ("CMOS"), bipolar, or bipolar-CMOS ("BiCMOS") processes.

In some embodiments, the depth or thickness of dielectric platform 18 may range from about 1 μm to about 40 μm and the width of dielectric platform 18 may be at least about 3 μm or greater. The depth or thickness of dielectric platform 18 may be measured from top surface 16 of substrate 14 to a lower boundary or surface 90 of dielectric platform 18. In some embodiments, lower surface 90 of dielectric platform 18 is parallel to, or substantially parallel to surface 16 of substrate 14. In some embodiments, lower surface 90 of dielectric platform 18 is at a distance of at least about one micron or greater below surface 16 and the width of dielectric platform 18 is at least about three microns or greater. In other embodiments, lower surface 90 of dielectric platform 18 is at a distance of at least about three microns or greater below surface 16 and the width of dielectric platform 18 is at least about five microns or greater. In one example, the thickness of dielectric platform 18 may be about 10 μm and the width of dielectric platform 18 may be about 10 μm. In yet other embodiments, it may be desirable that the thickness of the dielectric platform be equal to, or approximately equal to, the thickness of semiconductor substrate 14, for example, the thickness of the semiconductor die and the width of dielectric platform 18 may be up to about 100 μm. The thickness and width of dielectric platform 18 may be varied depending on the application for dielectric platform 18 and the desired die size of the resulting semiconductor device that uses substrate 14. For example, a relatively thicker dielectric platform may be desired in applications where dielectric platform 18 is used to form high Q passive devices compared to an application where dielectric platform 18 is used for isolation.

In one or more embodiments, dielectric platform 18 is capable of isolating one or more transistor types from one or more other transistor types, and/or to isolate different regions of substrate 14 including surrounding and/or enclosing one or more areas of substrate 14. For example, in one or more embodiments, dielectric platform 18 may have a ring or annular type shape capable of enclosing or at least partially enclosing an area or region within the ring, to isolate the inner region of the ring from the outer region of the ring. In such an embodiment, active region 20 may be disposed within the interior of the ring formed by dielectric platform 18 to be physically and/or electrically isolated from another active region 21 disposed exterior to the ring formed by dielectric platform 18. Likewise, dielectric platform 18 may comprise other various shapes and/or forms to provide isolation between two or more adjacent regions of substrate 14, and the scope of the claimed subject matter is not limited in this respect.

In some embodiments, the height of structures 70 is equal to, or approximately equal to, the height of the portion of dielectric region 71 that is below surface 16 of substrate 14. For example, if lower surface 90 of dielectric region 71 about three microns below surface 16, then dielectric structures 70 has a height of about three microns or greater. In other words, if lower surface 90 of dielectric region 71 is at least about three microns or greater from upper surface 16 of substrate 14, then dielectric structures 70 extend a distance of at least about three microns or greater from lower surface 90 of dielectric region 71. In one example, lower surface 90 extends to a distance of about one micron from upper surface 16 of substrate 14 and dielectric structures 70 have a height of about one micron. Although the dielectric structures 70 are illustrated as having a height that is approximately equal to the depth or thickness of dielectric region 71, this is not a limitation of the present invention. In other embodiments, the height of a dielectric structure 70 may be greater than, or less than, the thickness of dielectric region 71. For example, dielectric region 71 may extend a distance of at least about ten microns below surface 16 and dielectric structures 70 may extend a distance of about seven microns from lower surface 90.

Although a plurality of dielectric pillars extending from the floor of a single cavity have been described, it should be noted that a plurality of cavities may be formed in substrate 14. The multiple cavities may be laterally bounded by dielectric walls, dielectric partitions, or the like. In embodiments in which multiple cavities are formed in dielectric platform 18, dielectric platform 18 has a closed-cell configuration in that the cavities of dielectric platform 18 may be physically isolated from each other by the dielectric walls. Accordingly, if there is any rupture or fracture in dielectric platform 18, contamination of any gases in the cavities may be contained in a limited area due to the closed-cell configuration because the multiple cavities of dielectric platform 18 are physically isolated from each other.

Figure 4:
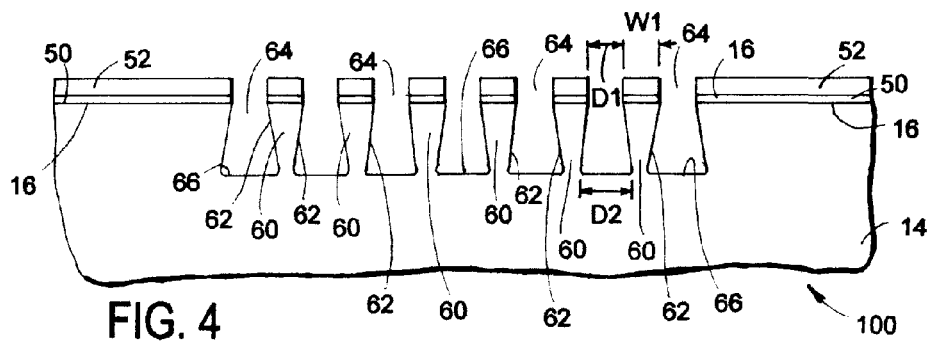
FIG. 4 is a cross-sectional view of the semiconductor structure of FIG. 3 at a later stage of manufacture.

The combination of dielectric material 71 and cavity 64A reduces the overall permittivity of the dielectric platform 18 so that dielectric platform 18 has a relatively low dielectric constant. In other words, sealed cavities 64A and dielectric material 71 together reduce the dielectric constant of dielectric platform 18. To minimize the dielectric constant of dielectric platform 18, it is desirable to increase the depth of dielectric platform 18, increase the volume of sealed cavities 64A and reduce the extent of semiconductor material 14 contained in vertical structures 60 (FIG. 4). In some embodiments, a dielectric constant of at least about 1.5 or lower may be achieved by increasing the volume of cavity 64A. The dielectric constant of dielectric platform 18 is reduced compared to, for example, what would be provided by a dielectric platform that has no cavities or voids. The dielectric constant of dielectric platform 18 may also be reduced by increasing the volume of dielectric material in vertical structures 60 (FIG. 4). Since empty space has the lowest dielectric constant (the dielectric constant of empty space is 1), the more empty space or void space incorporated into the dielectric platform, the lower the overall dielectric constant. Accordingly, increasing the volume of sealed cavities 64A relative to the volume of vertical structures 60 (FIG. 4) is more effective in decreasing the dielectric constant of dielectric platform 18 compared to increasing the volume of dielectric material in vertical structures 60 (FIG. 4).

Additionally, less stress is induced in substrate 14 by dielectric platform 18 compared to a solid or filled dielectric structure, because dielectric platform 18 includes substantial volumes that are not occupied by solids having coefficients of thermal expansion that differ from that of substrate 14. A solid or filled dielectric structure (not shown) that includes, for example, an oxide material with no voids may generate stress in an adjacent silicon region during heating and cooling of the dielectric structure and the silicon region due to the coefficient of thermal expansion (CTE) mismatch of silicon and oxide. Accordingly, the stress on the silicon lattice may lead to defects or dislocations in the silicon region. The dislocations may lead to undesirable excessive leakage currents in active devices formed in the active region, and therefore, forming a dielectric structure such as dielectric platform 18 which has cavity 64A, can reduce or prevent the formation of dislocations in the adjacent active regions, such as active regions 20 and 21, since cavity 64A can provide relief for the stress. Furthermore, less stress is generated in the formation of dielectric platform 18 compared to a solid or substantially solid dielectric structure in which the solid or substantially solid regions are formed by oxidation because, for example, in silicon, oxidation is accompanied by a 2.2× volume increase.

Silicon dioxide has a dielectric constant of about 3.9. Accordingly, a solid or filled dielectric structure that includes no voids and includes silicon dioxide may have a dielectric constant of about 3.9. As is discussed above, since empty space has the lowest dielectric constant (the dielectric constant of empty space is 1), the more empty space or void space incorporated into the dielectric platform, the lower the overall dielectric constant.

In some embodiments described herein, dielectric platform 18 includes one or more voids occupying in excess of 40% of the total volume of dielectric platform 18. This may result in an effective dielectric constant reduction of about 30% or greater, from a dielectric constant of about 3.9 to an effective dielectric constant of about 2.74. In one embodiment, dielectric platform 18 includes one or more voids occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 18 may result in a dielectric platform 18 having a dielectric constant of about 1.5 or less. As a result, passive elements formed over dielectric platform 18 have reduced parasitic capacitances to the substrate 14. The parasitic substrate capacitance is reduced by both the reduced effective dielectric constant of dielectric platform 18 and the increased thickness of dielectric platform 18.

In addition, dielectric platform 18 may be used to increase the frequency of operation of any devices formed using semiconductor structure 100. For example, passive components such as, for example, inductors, capacitors, or electrical interconnects, may be formed over the embedded dielectric platform 18 and may have reduced parasitic capacitive coupling between these passive components and semiconductor substrate 14 since the embedded dielectric platform 18 has a relatively low dielectric constant or permittivity and since the embedded dielectric platform 18 increases the distance between the passive components and the conductive substrate. Reducing parasitic substrate capacitances may increase the frequency of operation of any devices formed using a dielectric platform. As an example, the passive component may comprise electrically conductive material 23, wherein electrically conductive material 23 may comprise, for example, aluminum, copper, or doped polycrystalline silicon. In various examples, the passive component may be an inductor, a capacitor, a resistor, or an electrical interconnect and may be coupled to one or more active devices formed in active regions 20 and 21.

At least a portion of dielectric platform 18 may be formed below a top surface 16 of substrate 14. In some embodiments, a majority of dielectric platform 18 is below top surface 16 of substrate 14. In other embodiments, all of, or substantially all of, dielectric platform 18 is below top surface 16 of substrate 14. Since at least a portion of dielectric platform 18 is formed in and below the surface of the silicon substrate, dielectric platform 18 may be referred to as an embedded dielectric structure. Embedded may mean that at least a portion of dielectric platform 18 is below a plane (not shown) that is coplanar to, or substantially coplanar to, top surface 16 of substrate 14. In some embodiments, the portion of dielectric platform 18 below the plane extends from the plane to a depth of at least about three microns or greater below the plane and the portion of dielectric platform 18 below the plane has a width of at least about five microns or greater. In other words, a least a portion of dielectric platform 18 is embedded in substrate 14 and extends a distance of at least about three microns or greater from upper surface 16 toward the bottom surface of substrate 14 and the portion of dielectric platform 18 embedded in substrate 14 has a width of at least about five microns or greater in some embodiments.

Further, dielectric platform 18 may be used to form relatively high quality passive devices such as, for example, capacitors and inductors having a relatively high Q since the dielectric platform 18 may be used to isolate and separate the passive devices from the substrate. Active devices, such as transistors or diodes, may be formed in regions adjacent to, or abutting, dielectric platform 18, and these active devices may be coupled to passive components such as spiral inductors, interconnects, microstrip transmission lines and the like that are formed on a planar upper surface of dielectric platform 18. Increasing the distance between the passive components and silicon substrate 14 allows higher Qs to be realized for these passive components.

As an example, a field effect transistor ("FET") 101 may be formed in active region 20 and a FET 102 may be formed in active region 21. FET 101 may be a MOSFET and may include a source region 110 in a portion of substrate 14, a drain region 112 in a portion of substrate 14, a gate oxide 114 over a portion of substrate 14, a gate 116 over gate oxide 114, and a channel region 118 formed in a portion of substrate 14 under gate oxide 114 and between doped regions 110 and 112. FET 102 may be a MOSFET and may include a source region 120 in a portion of substrate 14, a drain region 122 in a portion of substrate 14, a gate oxide 124 over a portion of substrate 14, a gate 126 over gate oxide 124, and a channel region 128 formed in a portion of substrate 14 under gate oxide 124 and between doped regions 120 and 122. The source, drain, and channel regions of a FET can be formed by forming a doped region in semiconductor substrate 14 and therefore the source, drain and channel regions of a FET may be referred to as doped regions.

As discussed above, substrate 14 may comprise a semiconductor material such as, for example, silicon. Substrate 14 may serve as part of a drain region of a vertical transistor formed in active region 21. In this example, a source contact or electrode (not shown) may be formed on or adjacent to an upper surface of substrate 14 and a drain electrode (not shown) may be formed on or adjacent to a lower surface of substrate 14. During operation, the electrical current flow from the source electrode to the drain electrode in the vertical transistor may be substantially perpendicular to the upper and lower surfaces of semiconductor structure 100. In other words, current flows essentially vertically through the vertical transistor from the electrode located adjacent a top surface of semiconductor structure 100 to a drain electrode located adjacent to the opposite bottom surface of semiconductor structure 100. An example of a vertical transistor is described in United States ("US") patent application having application Ser. No. 10/557,135, titled "POWER SEMICONDUCTOR DEVICE AND METHOD THEREFOR," filed Nov. 17, 2005, which claims priority to Patent Cooperation Treaty ("PCT") International Application Number PCT/US2005/000205 titled "POWER SEMICONDUCTOR DEVICE AND METHOD THEREFOR," having an International Filing Date of Jan. 6, 2005, and an International Publication Date of Jul. 28, 2005, the contents of both of these patent applications are incorporated herein by reference in their entirety.

Power transistors having relatively high breakdown voltages, and consequently relatively high output power, may be realized by forming a vertical transistor in an active area adjacent to dielectric platform 18, as dielectric platform 18 may provide edge termination for the equipotential lines from an electric field in an active area that is adjacent to dielectric platform 18. Higher breakdown voltages may be achieved as the edge termination provided by dielectric platform 18 may reduce curvature of the equipotential lines. As is generally understood, curvature of the equipotential lines results in lower breakdown voltages. To maximize breakdown voltage, the equipotential lines are parallel, or substantially parallel, to upper surface 16 of substrate 14, and these equipotential lines are planar with little, to no curvature.

If relatively high breakdown voltages are desired, then the lateral sidewall of dielectric platform 18 that contacts the active region is formed to be a dielectric material that is perpendicular, or substantially perpendicular, relative to the upper surface 16 of substrate 14 to allow the equipotential lines to terminate substantially perpendicular at the lateral sidewall dielectric platform 18. If the lateral sidewall of dielectric platform 18 is angled relative to the upper surface 16 of substrate 14, then this may not reduce curvature of the equipotential lines as desired, and therefore, dielectric termination structure 26 that includes trench 54 and oxide layer 55 may be included to provide a perpendicular, or substantially perpendicular, dielectric sidewall structure to provide edge termination.

It should be noted that including dielectric termination structure 26 is optional. Termination structure 26 may be desirable in applications where high voltage and/or high power is desired and where the lateral boundaries of dielectric platform 18 do not include a sidewall that is substantially perpendicular to upper surface 16 of substrate 14. For example, referring to FIG. 1, the lateral sidewall 72 of dielectric region 71 is angled, and not perpendicular, to surface 16 of substrate 14. Accordingly, termination structure 26 may be included to provide a dielectric sidewall 57 that is perpendicular to, or substantially perpendicular to, surface 16 and is non-parallel, or substantially non-parallel, to the lateral boundary of region 71.

Dielectric termination structure 26 may be adjacent to, abutting, and/or surrounding, active areas 20 and 21 to provide edge termination for terminating equipotential lines in active areas 20 and 21, which may result in relatively higher breakdown voltages for active devices formed in the active areas.

Similarly, in embodiments where termination structure 26 is omitted, dielectric platform 18 may be adjacent to, abutting, and/or surrounding, active areas 20 and 21 to provide edge termination for terminating equipotential lines in the active areas, which may result in relatively higher breakdown voltages for some kinds of active devices such as, for example, vertical transistors, formed in the active areas. In addition, if dielectric platform 18 surrounds one or more active areas, then dielectric platform 18 may also be used to provide electrical isolation. For example, dielectric platform 18 may be used to electrically isolate active regions from each other, which may also result in electrical isolation between any active devices formed in the isolated active areas.

Although only a single active device is discussed as being formed in active regions 20 and 21, the methods and apparatuses described herein are not limited in this regard. In some embodiments, a plurality of active devices may be formed in active regions 20 and 21. Further, the types of active devices are not limited to being FETs. Other types of devices that may be formed in active regions 20 and 21 include bipolar junction transistors, junction field effect transistors, insulated gate bipolar junction transistors, diodes, thyristors, passive devices, or the like.

Figure 2:
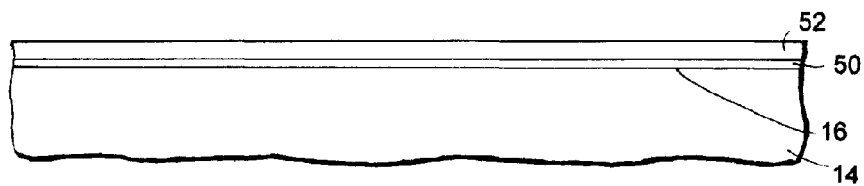
FIG. 2 is a cross-sectional view of the semiconductor structure of FIG. 1 at an early stage of manufacture.
Figure 18:
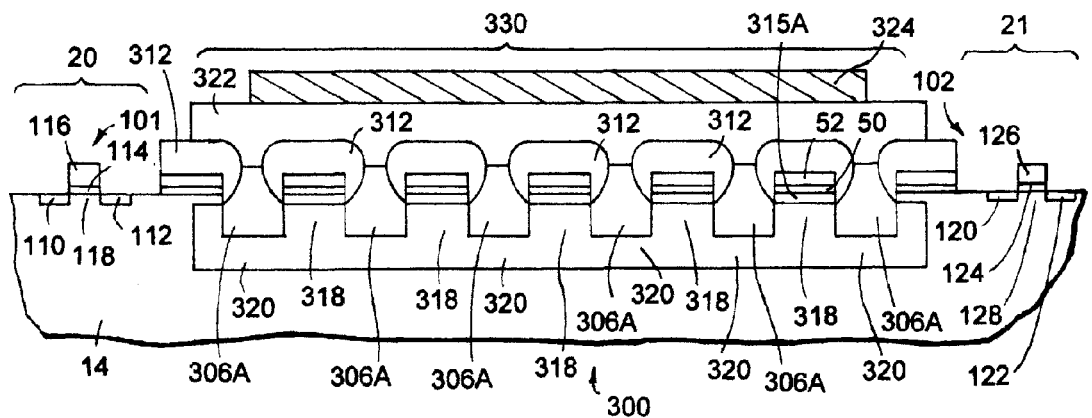
FIG. 18 is a cross-sectional view of the semiconductor structure of FIG. 17 at a later stage of manufacture.

FIG. 2 is a cross-sectional view of a semiconductor structure at a beginning stage of manufacture. What is shown in FIG. 2 is semiconductor substrate 14, which may be used as a substrate for the fabrication of semiconductor structures 100 (FIG. 1), 200 (FIG. 9), 250 (FIG. 10), and 300 (FIG. 18). Substrate 14 may comprise a semiconductor material such as, for example, silicon, and may be doped or undoped depending on the application, although the methods and apparatuses described herein are not limited in this regard. Substrate 14 may have a thickness ranging from about 100 µm to about 1,000 µm. However, the thickness of substrate 14 may be reduced through subsequent thinning processes in some embodiments.

A layer of dielectric material 50 is formed on substrate 14. Layer 50 comprises, for example, silicon dioxide ($SiO_2$) and may have a thickness ranging from about 50 Å to about 800 Å. Dielectric layer 50 may be formed using deposition techniques or thermal growth techniques such as, for example, thermal oxidation of silicon.

A layer of dielectric material 52 is formed on dielectric layer 50. Layer 52 comprises, for example, silicon nitride ($Si_3N_4$) and may have a thickness ranging from about 100 Å to about 2000 Å. In some embodiments, dielectric layer 52 has a thickness that is about two times (2×) greater than the thickness of dielectric layer 50. Dielectric layer 52 may be formed using a low pressure chemical vapor deposition (LPCVD).

Dielectric layer 52 may be useful as an etch stop, a protective layer, and/or a mask layer during the processing of structure 100. Oxide layer 50 is between silicon substrate 14 and silicon nitride layer 52 to prevent damage that may result from forming silicon nitride layer 52 directly on substrate 14. An advantage of forming dielectric layer 52 as silicon nitride and dielectric layer 50 as silicon dioxide is that the silicon nitride serves as an oxidation barrier during subsequent oxidation steps.

Dielectric layer 52 or a combination of dielectric layer 50 and dielectric layer 52 may serve as a hard mask, and may be referred to as a masking layer. Since the photoresist over dielectric layer 52 is also etched as part of the silicon etch used to etch portions of substrate 14, dielectric layer 52 or a combination of dielectric layer 50 and dielectric layer 52 may be used as a hard mask to prevent the undesired etching of the upper surface of substrate 14 during the formation of cavity 64 (FIG. 4). Layers 50 and 52 are optional, as in alternate embodiments, the photoresist layer may be made relatively thick such that it is not completely eroded during the etching process, and therefore, the photoresist may be used as a masking layer.

Figure 3:
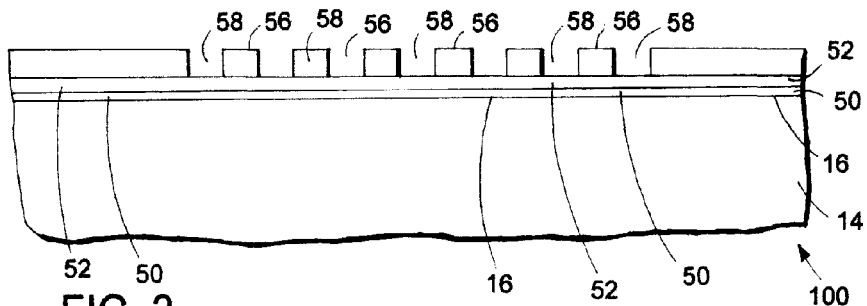
FIG. 3 is a cross-sectional view of the semiconductor structure of FIG. 2 at a later stage of manufacture.

Referring now to FIG. 3, a layer of photoresist (not shown) is dispensed on silicon nitride layer 52. The layer of photoresist is patterned to form a masking structure 56 having openings 58 that expose portions of silicon nitride layer 52.

Figure 5:
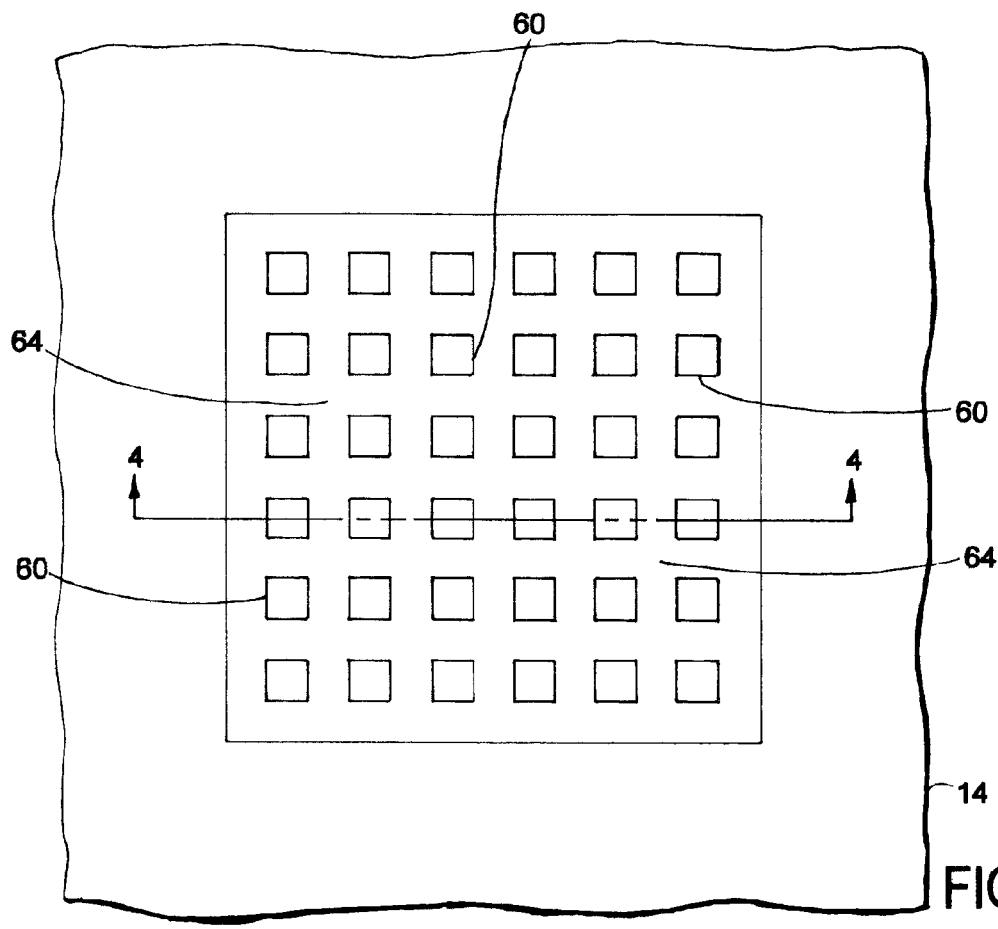
FIG. 5 is a top view of the semiconductor structure of FIG. 4.

FIG. 4 is a cross-sectional side view of the structure of FIG. 3 at a later stage of manufacture. FIG. 5 is a top view of the structure of FIG. 4 in accordance with an embodiment of the invention, and FIG. 4 is a cross-sectional side view taken along section line 4-4 of FIG. 5. With reference to FIGS. 4 and 5, the exposed portions of silicon nitride layer 52 and the portions of silicon dioxide layer 50 and substrate 14 that are below the exposed portions of silicon nitride layer 52 are removed by, for example, etching, to form a plurality of structures 60 having sidewalls 62. In other words, the etch forms an opening 64 having a floor 66 from which structures 60 extend. Structures 60 extend from floor 66 to surface 16. Structures 60 may be pillars, columns, or walls and are also referred to as protrusions or vertical structures. Although structures 60 are described and shown as pillars herein, the methods and apparatuses described herein are not limited in this regard. Although not shown, as mentioned above, in other embodiments, pillars 60 may be walls such as, for example, elongated walls. Opening 64 is also referred to as a cavity.

In some embodiments, cavity 64 may be formed using at least one etch operation to remove portions of layers 50 and 52, and substrate 14. In other embodiments, two or three etching operations may be used to form cavity 64. For example, one etch operation may be used to remove portions of layers 50 and 52 and another etch operation may be used to remove portions of substrate 14. As another example, three etch operations may be used to remove portions of layer 52, layer 50, and substrate 14.

Silicon nitride layer 52 may be etched using a wet chemical etch or a dry etch process such as, for example, a reactive ion etch (RIE). Silicon dioxide layer 50 may be etched using a wet chemical etch or a dry etch process such as, for example, a reactive ion etch (RIE). A portion of substrate 14 may next be removed using an anisotropic etch process such as, for example, reactive ion etching (RIE).

In some embodiments, the etch chemistry is selected so that sidewalls 62 form an angle that is not perpendicular to surface 16. For example, the angle may be greater than ninety degrees so that pillars 60 are tapered such that the upper portions of pillars 60 are wider than the lower portions of pillars 60. In other words, the spacing or distance between pillars 60 at the upper portions of pillars 60 is substantially different than the distance between pillars 60 at the lower portions of pillars 60. In some embodiments, the distance between the upper portions of pillars 60 is substantially smaller, or less than, the distance between the lower portions of pillars 60. In FIG. 4, the distance between the upper portions of pillars 60 is labeled D1 and the distance between the lower portions of pillars 60 is labeled D2. As an example, the distance between the lower portions of pillars 60 may be at least about one hundred five percent (105%) or greater than the distance between the upper portions of pillars 60. Thus, if the distance D1 is about one micron, then the distance D2 is about 1.05 microns or greater. In another example, the distance between the lower portions of pillars 60 is at least about one hundred fifty percent (150%) or greater than the distance between the upper portions of pillars 60. In other words, the distance between the lower portions of pillars 60 is more than about one hundred fifty percent (150%) of the distance between the upper portions of pillars 60. Thus, in this example, if the distance D1 is about one micron, then the distance D2 is about 1.5 microns or greater. Increasing the distance D2 relative to the distance D1 will further increase the area of empty space in dielectric platform 18, and consequently, will further reduce the effective dielectric constant of dielectric platform 18.

As stated above, in some embodiments, the etch chemistry is selected so that sidewalls 62 form an angle that is not perpendicular to top surface 16. In some embodiments, trenches with non-vertical sidewalls are formed using reactive ion etching ("RIE"). Using RIE, high aspect ratio (the ratio of depth of the structure to the width of the cavity to be etched) structures 60 may be formed. In one example a series of alternating passivation and etch steps is used which comprise a passivation step that coats all exposed surfaces, an etch step which preferentially removes the passivation in certain regions and then a subsequent etch of the exposed portions. The passivation/etch cycles are repeated to form a high aspect ratio structure. As an example, an initial etch of substrate 14 may be performed to form one or more trenches in substrate 14 and then the passivation step may include forming a passivation layer that comprises a polymer (not shown) using a deposition process that forms the passivation layer along the sidewalls and bottoms of the trenches. The etching step may include a dry etch that preferentially removes the portions of the passivation layer that are at the bottom and lower portions of the trenches. In other embodiments, one or more of the etch process parameters are varied during the process to achieve a specific sidewall profile. Examples of process parameters that can be varied include pressure, etch cycle time, passivation formation cycle time, the amount of precursor used for passivation, the amount of precursor used for etching, and power.

Figure 6:
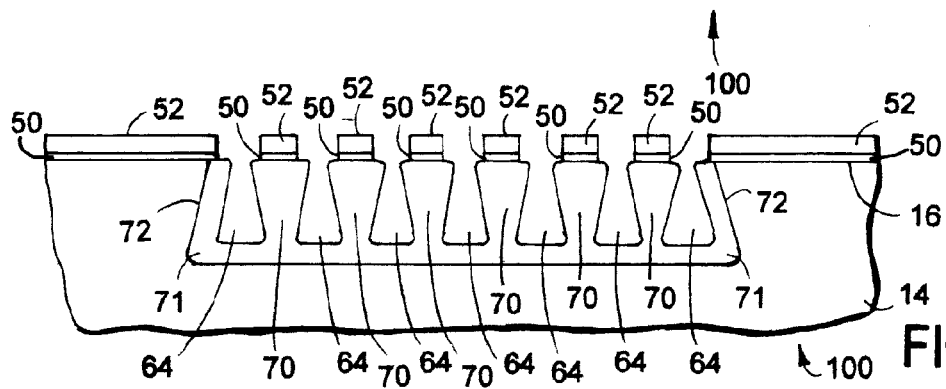
FIG. 6 is a cross-sectional view of the semiconductor structure of FIG. 4 at a later stage of manufacture.

As is discussed below with reference to FIG. 6 a thermal oxidation is performed to convert a portion of, all of, or substantially all of, the silicon of pillars 60 to silicon dioxide to form silicon dioxide pillars 70 (FIG. 6). Accordingly, the distance D1 is selected so that after the thermal oxidation, the upper portions of silicon dioxide pillars 70 (FIG. 6) are separated from each other and do not contact each other. In some embodiments, the distance D1 ranges from about 0.5 microns to about 2 microns and the distance D2 is at least about 5% greater than the distance D1. The width of the upper portion of silicon pillar 60 is labeled W1 and is about 1.5 microns or less in some embodiments. It should be noted that the thicker the width W1, the longer it will take to oxidize silicon pillar 60. The dimension W1 may be referred to as a diameter depending on the shape of structure 60. In some embodiments, after the thermal oxidation process is performed as is described with reference to FIG. 6 to convert a portion of, all of, or substantially all of, silicon pillars 60 from silicon to silicon dioxide, the distance between the upper portions of silicon dioxide pillars 70 (FIG. 6) is about one micron or less and the distance between the lower portions of silicon dioxide pillars 70 (FIG. 6) is at least about 1.5 microns or greater. Further, the width of the lower portion of silicon dioxide structure 70 is substantially smaller than the width of the upper portion of silicon dioxide structure 70. For example, the width of the upper portion of silicon dioxide structure 70 is at least about two times (2×) greater than the width of the lower portion of silicon dioxide structure 70. In other words, the width of the upper portion of silicon dioxide structure 70 is more than about two times (2×) the width of the lower portion of silicon dioxide structure 70 in some embodiments. For example if the width of the upper portion of silicon dioxide structure 70 is about 1.5 microns, then the width of the lower portion of silicon dioxide structure 70 is about 0.75 microns or less. In some embodiments, the width of the upper portion of silicon dioxide structure 70 is about four times (4×) the width of the lower portion of silicon dioxide structure 70, although the methods and apparatuses described herein are not limited in this regard. As may be appreciated, decreasing the width at the lower portions of structures 70 will further increase the amount of empty space in dielectric platform 18 which will result in a dielectric platform with a relatively lower effective dielectric constant.

Masking structure 56 (FIG. 3) is stripped or removed after the removal of portions of 52, 50, and 14. This oxidation also converts a portion of substrate 14 which is exposed between adjacent pillars 60 and the exposed edges of cavity 64 to silicon dioxide.

Although a square shaped cavity 64 is illustrated in FIG. 5, this is not a limitation of the present invention. In other embodiments, dielectric platform 18 may be formed to surround a portion of substrate 14. Accordingly, cavity 64 may be formed surrounding a portion of substrate 14. This may be desirable to isolate a portion of substrate 14 from another portion of substrate 14 using dielectric platform 18.

FIG. 6 is a cross-sectional view of semiconductor structure 100 at a later stage of manufacture. A thermal oxidation process is performed so that the exposed silicon of structure 100 is converted to silicon dioxide, thereby forming a silicon dioxide layer or region 71 which includes silicon dioxide pillars 70. In particular, the silicon of silicon pillars 60 (FIG. 4) may be partially, or in the embodiment illustrated in FIG. 6, completely converted to silicon dioxide to form silicon dioxide pillars 70. In other words, the silicon between the sidewalls 62 (FIG. 6) of pillars 60 may be substantially converted to silicon dioxide in some embodiments. In addition, as shown in FIG. 6, during the thermal oxidation process, the bottom of cavity 64, that is floor 66 (FIG. 4), is also converted to silicon dioxide to form the lower portion of region 71. Since the dielectric constant of silicon is greater than the dielectric constant of silicon dioxide, reducing the amount of silicon in pillar 70 will reduce the effective dielectric constant of dielectric platform 18.

As is well known, about 2.2 units of silicon dioxide is formed from about one unit of silicon during thermal oxidation. In other words, about 2.2 Angstroms of thermal oxide may be formed from about one Angstrom of silicon. As a result, the formation of silicon dioxide during the thermal oxidation process illustrated with reference to FIG. 6 has the effect of decreasing the spacing between pillars 60 (FIGS. 4 and 5) during the thermal oxidation process. Thus, the spacing between the resulting silicon dioxide pillars 70 is less than the spacing between pillars 60 (FIGS. 4 and 5).

As may be appreciated, subsequent capping of cavity 64 may be facilitated by the thermal oxidation process and the initial shape of pillars 60 (FIGS. 4 and 5), wherein the upper portions of pillars 60 are spaced closer to each other compared to the lower portions of pillars 60. In particular, the spacing between the upper portions of pillars 60 (FIGS. 4 and 5) is decreased to a distance that will facilitate capping or sealing of cavity 64 using, for example, a non-conformal dielectric material. In addition, the effective dielectric constant of the resulting dielectric platform 18 is reduced due to the initial shape of pillars 60 (FIGS. 4 and 5), as the shape of pillars 60 allows for increasing the amount of empty space in dielectric platform 18. In other words, the shape of pillars 60 allows for the decreasing of the amount of silicon or silicon dioxide material in dielectric platform 18.

Although the thickness or the amount of the silicon dioxide of pillars 70 is limited after all of the silicon of pillars 70 is consumed during the thermal oxidation process, the thermal oxidation process may continue longer to increase the thickness of the silicon dioxide at the lateral and lower boundaries of dielectric platform 18. In other words, the oxidation process may continue longer to increase the amount of silicon dioxide at the bottom of cavity 64 and along the lateral perimeter of cavity 64.

Figure 7:
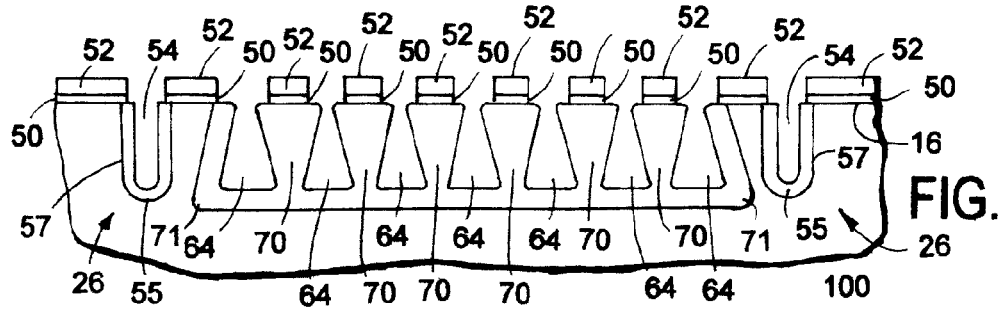
FIG. 7 is a cross-sectional view of the semiconductor structure of FIG. 6 at a later stage of manufacture.

FIG. 7 is a cross-sectional view of semiconductor structure 100 at a later stage of fabrication. After the oxidation process is performed, silicon nitride layer 52, silicon oxide layer 50, and semiconductor material 14 may be patterned using photolithography and etching processes. Photolithography processes or operations involve the use of masks and may sometimes be referred to as masking operations or acts. The photolithography and etching may include forming a layer of a radiation-sensitive material, such as photoresist (not shown), over structure 100 at the stage of manufacture illustrated in FIG. 6, then exposing the photoresist using, for example, ultraviolet (UV) radiation to form a mask, and then etching portions of layer 52, layer 50, and semiconductor material 14 using an anisotropic etch process such as, for example, a reactive ion etch (RIE), to form a trench 54 that surrounds dielectric platform 18. Trench 54 may also be referred to as an opening, a cavity, a void, a gap, an empty region, an empty space, or the like.

After trench 54 is formed, the photoresist mask (not shown) over structure 100 used to form trench 54 is stripped or removed. Next, a dielectric layer 55 is formed along the sidewall of trench 54. Dielectric layer 55 and trench 54 form a dielectric termination structure 26 as is discussed above. In some embodiments, dielectric layer 55 is an oxide layer such as silicon dioxide having a thickness ranging from about 50 Angstroms to about 5000 Angstroms. Oxide layer 55 may be formed using deposition techniques or thermal growth techniques such as, for example, thermal oxidation of silicon.

If a thermal oxidation process is used to form oxide layer 55, then other portions of structure 100 may also be affected by the oxidation. For example, the amount of silicon dioxide at the bottom of cavity 64 and along the lateral perimeter of cavity 64 may be increased as part of this thermal oxidation. Further, in alternate embodiments, pillars 70 may be partially oxidized during the initial thermal oxidation described with reference to FIG. 6 so that pillars 70 comprise silicon and silicon dioxide and then part of, or all of, the remaining silicon in pillars 70 may be further converted to silicon dioxide using the subsequent thermal oxidation process that is used to form oxide layer 55. Accordingly, the thickness of oxide layer 55 and the amount of silicon dioxide at the bottom of cavity 64, along the lateral perimeter of cavity 64, and in pillars 70 may be controlled by varying the timing of the two thermal oxidation processes used to form pillars 70 and oxide layer 55.

Figure 8:
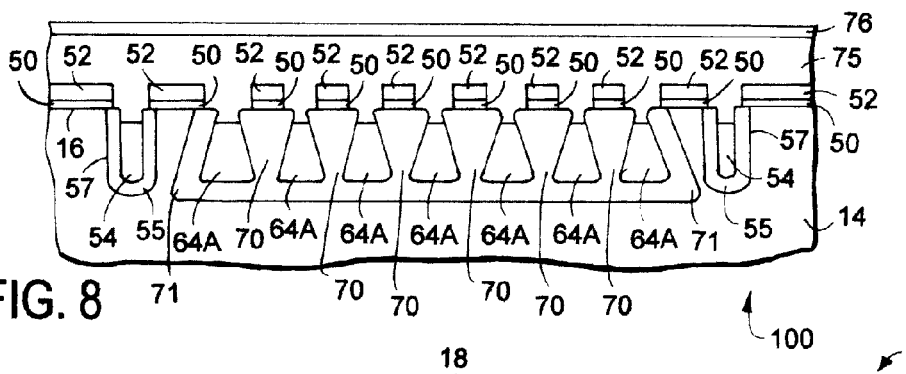
FIG. 8 is a cross-sectional view of the semiconductor structure of FIG. 7 at a later stage of manufacture.

Referring now to FIG. 8, capping structure 75 is formed over dielectric pillars 70. In some embodiments, capping structure 75 may comprise silicon dioxide and may be formed by low temperature chemical vapor deposition (CVD). Other suitable materials for capping structure 75 include silicon nitride, silicon oxide, phosphosilicate glass (PSG), borophosphosilicate glass (BPSG), an oxide formed using tetraethylorthosilicate (TEOS), or the like. Capping structure 75 may have a thickness ranging from about 1000 Angstroms to about 4 microns. During formation of capping structure 75, the material of the capping structure may enter a portion of cavity 64, that is the material of capping structure 75 may enter between the upper portions of adjacent pillars 70, but not fill cavity 64 due in part to the relatively small size of the openings between the upper portions of pillars 70, thereby forming a capped or sealed cavity 64A. Capping structure 75 is planarized using, for example, a Chemical Mechanical Planarization ("CMP") technique. In an alternate embodiment, the material of capping structure 75 may substantially or completely fill cavity 64.

An optional sealing layer 76 such as, for example, silicon nitride ($Si_3N_4$), may be formed over silicon dioxide layer 75 to hermetically seal cavity 64. In other words, in embodiments where capping layer 75 is a silicon dioxide layer, the optional conformal silicon nitride layer 76 may prevent diffusion through and/or fill in any openings or cracks in the silicon dioxide capping layer 75, and in general prevent the propagation of gases or moisture into cavities 64A through capping layer 75. Silicon nitride layer 76 may be formed using a low pressure chemical vapor deposition (LPCVD) and may have a thickness of ranging from about 100 Angstroms to about 5000 Angstroms. In one embodiment, the thickness of silicon nitride layer 76 is about 500 Angstroms. A partial vacuum may be formed in sealed cavities 64A as part of the LPCVD process. For purposes of clarity, sealing layer 76 is not shown in FIG. 1. If optional sealing layer 76 is used, the CMP is performed prior to the formation of optional sealing layer 76 since the CMP may completely remove the relatively thin sealing layer 76.

Accordingly, the capping or sealing of cavities 64A may be accomplished by forming a non-conformal material followed by a conformal material. In this example, the non-conformal layer such as, for example, layer 75, may enter into a portion of cavity 64A or a region between the upper portions of adjacent pillars 70, but not fill cavity 64A due in part to the relatively small size of the openings between the upper portions of pillars 70 and since layer 75 is a non-conformal layer. Then a conformal material such as, for example, layer 76, may be formed on layer 75.

In some embodiments, cavity 64 is evacuated to a pressure less than atmospheric pressure. In other words, the pressure in sealed cavity 64A is below atmospheric pressure. As an example, the pressure in cavity 64A may range from approximately 0.1 Torr to approximately 10 Torr. The type of substance or material within cavity 64A is not a limitation of the present invention. For example, cavity 64A may contain a gas, a fluid, or a solid matter.

Although a single capped or sealed cavity 64A is described with reference to FIGS. 4-7, the methods and apparatuses described herein are not limited in this regard. In other embodiments, substrate 14 may be etched in such as way as to form multiple isolated cavities. Accordingly, if capping structure 75 experiences a rupture or fracture, contamination from any gases in cavities 64A may be contained in a limited area due to the physical isolation of the multiple cavities from each other. Capping structure 75 in combination with dielectric pillars 70 and sealed cavity 64A together form Dielectric Platform ("DP") 18 shown in FIG. 1.

Referring back to FIG. 1, the portions of capping structure 75, silicon nitride layer 52 and silicon dioxide layer 50 in active regions 20 and 21 are removed after the formation of capping layer 75. Active and passive semiconductor devices may be formed in or from the portions of substrate 14 adjacent DP 18. In addition, active or passive circuit elements, or portions thereof, may be formed on DP 18. Referring again to FIG. 1, a passive circuit element 23 is formed on DP 18. As is noted above, for purposes of clarity, optional sealing layer 76 (FIG. 8) is not shown in FIG. 1.

Although dielectric platform 18 is described as having one or more cavities 64A, the methods and apparatuses described herein are not limited in this regard. For example, in alternate embodiments, cavity 64A could be filled with a material, such as, for example, a material comprising an oxide, nitride, or silicon if so desired, to form a solid or filled dielectric platform (not shown) that is devoid of any cavities. Such a solid or filled dielectric platform would have a relatively higher dielectric constant compared to an air-gap dielectric platform such as dielectric platform 18 since the material used to fill cavity 64A would have a higher dielectric constant compared to an opening or void. Examples of materials that may be used to fill, or backfill, cavity 64A may include silicon nitride, polycrystalline silicon, or an oxide material formed using, for example, a hot wall TEOS process.

Figure 9:
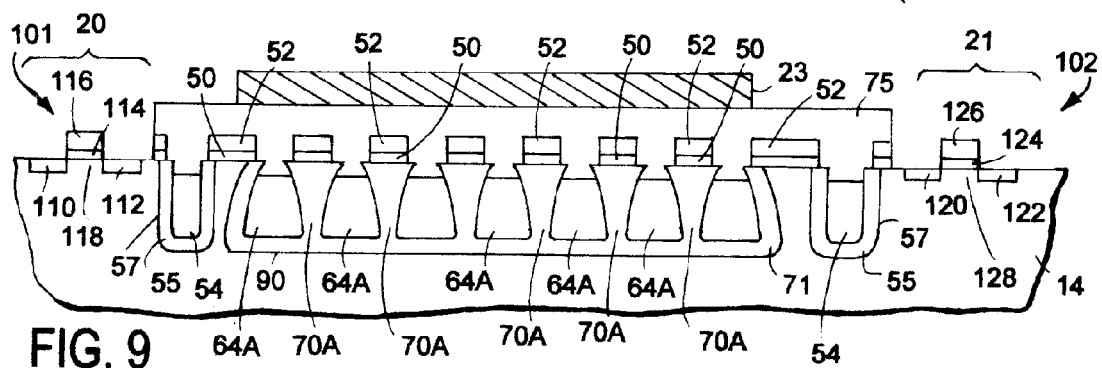
FIG. 9 is a cross-sectional view of another semiconductor structure in accordance with another embodiment of the present invention.

FIG. 9 is a cross-sectional view of a semiconductor structure 200 in accordance with another embodiment of the present invention. Structure 200 is similar to structure 100 of FIG. 1, except that dielectric platform 18 of structure 200 includes vertical dielectric structures 70A that have a different shape or profile compared to dielectric structures 70 (FIG. 1) of structure 100. As is discussed above with reference to FIG. 4, the sidewall profile of dielectric structures 70A shown in FIG. 9 may be achieved by selecting the appropriate etch parameters. In other words, the etch parameters can be changed as a function of time to control the sidewall profile to a desired shape. Examples of etch parameters that can be varied include pressure, etch cycle time, passivation formation cycle time, amount of precursor used for passivation, and the amount of precursor used for etching and power.

Similar to dielectric structures 70 (FIG. 1) of structure 100 (FIG. 1), the capping and sealing of cavity 64 may be facilitated by the shape of structures 70A since the upper portions of structures 70A are spaced closer to each other compared to the lower portions of structures 70A. In addition, the effective dielectric constant of the resulting dielectric platform 18 of structure 200 is reduced due to the shape of structures 70A, as the shape of structures 70A increases the amount of empty space in dielectric platform 18 compared to other types of dielectric platform structures.

Figure 10:
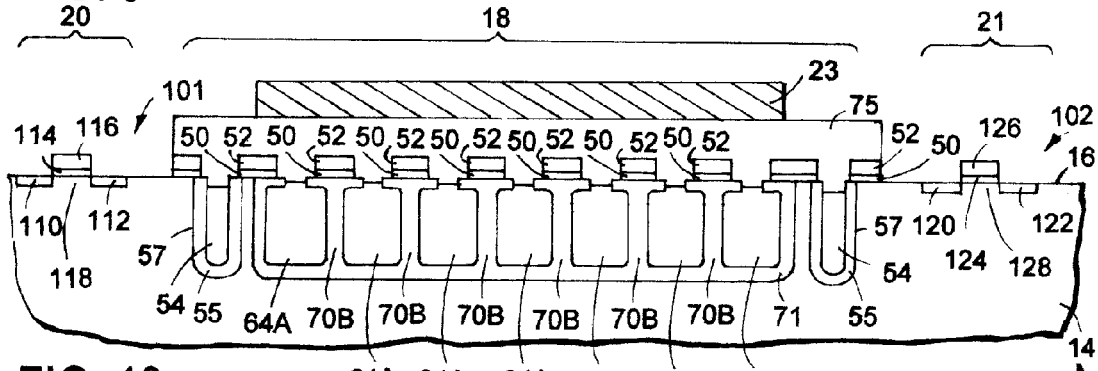
FIG. 10 is a cross-sectional view of another semiconductor structure in accordance with another embodiment of the present invention.

FIG. 10 is a cross-sectional view of a semiconductor structure 250 in accordance with another embodiment of the present invention. Structure 250 is similar to structure 100 of FIG. 1, except that dielectric platform 18 of structure 250 includes vertical dielectric structures 70B that have a different shape or profile compared to dielectric structures 70 (FIG. 1) of structure 100. As is discussed above with reference to FIG. 4, the sidewall profile of dielectric structures 70B shown in FIG. 10 may be achieved by selecting the appropriate etch parameters. In other words, the etch parameters can be changed as a function of time to control the sidewall profile to a desired shape. Examples of etch parameters that can be varied include pressure, etch cycle time, passivation formation cycle time, amount of precursor used for passivation, and the amount of precursor used for etching and power.

Similar to dielectric structures 70 (FIG. 1) of structure 100 (FIG. 1), the capping and sealing of cavity 64 may be facilitated by the shape of structures 70B since the upper portions of structures 70B are spaced closer to each other compared to the lower portions of structures 70B. In addition, the effective dielectric constant of the resulting dielectric platform 18 of structure 250 is reduced due to the shape of structures 70B, as the shape of structures 70B increases the amount of empty space in dielectric platform 18 compared to other types of dielectric platform structures.

Figure 11:
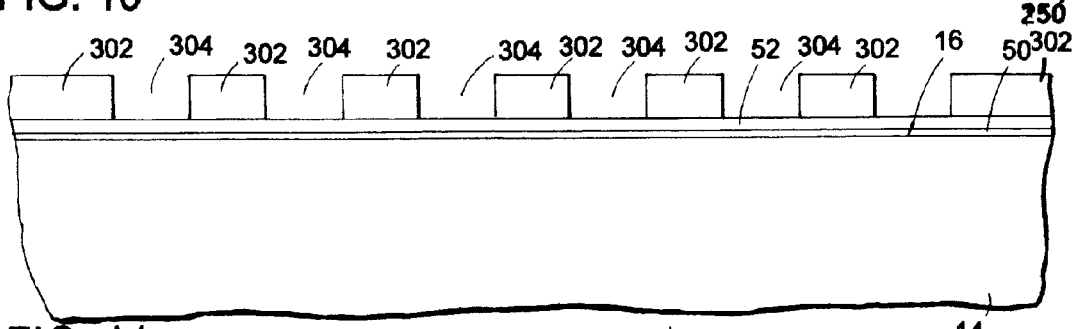
FIG. 11 is a cross-sectional view of another semiconductor structure at an early stage of manufacture in accordance with another embodiment of the present invention.

FIG. 11 is a cross-sectional view of a semiconductor structure 300 at an early stage of manufacture in accordance with another embodiment of the present invention. Substrate 14 and dielectric layers 50 and 52 have been described with reference to FIG. 2. A layer of photoresist (not shown) is dispensed on silicon nitride layer 52 and patterned to form a masking structure 302 and openings 304 that exposes portions of silicon nitride layer 52.

Figure 12:
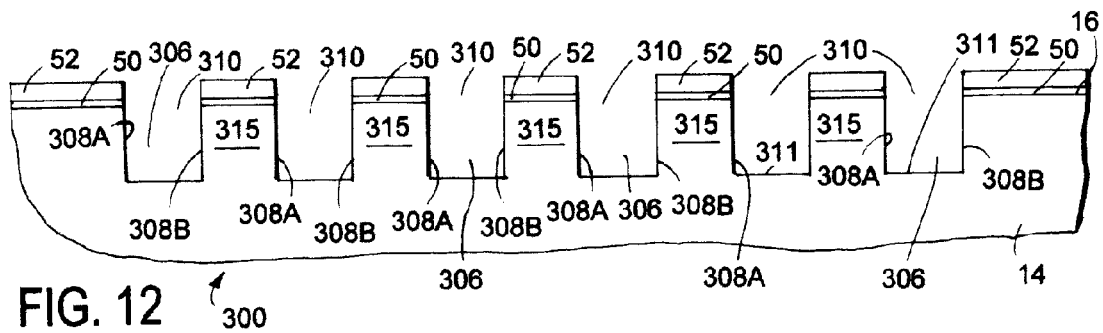
FIG. 12 is a cross-sectional view of the semiconductor structure of FIG. 11 at a later stage of manufacture.

Referring now to FIG. 12, the exposed portions of silicon nitride layer 52 and the portions of silicon dioxide layer 50 and substrate 14 that are below the exposed portions of silicon nitride layer 52 are removed by, for example, one or more etching operations to form trenches 306 in substrate 14. For example, an anisotropic etch may be used to form trenches 306. Trenches 306 have mouths or entrances 310 and floors or bottoms 311. Bottom 311 of a trench 306 may be referred to as a lower boundary. The portions of substrate 14 between trenches 306 form barriers or structures 315 having sidewalls labeled 308A and 308B. Structures 315 are also referred to as protrusions and may be pillars or walls. Masking structure 302 is removed after forming trenches 306. Although trenches 306 are described as being formed using an anisotropic etch, this is not a limitation of the present invention. Trenches 306 may be formed using an isotropic etch.

In some embodiments, boundary 311 of trenches 306 is at least about three microns or greater below upper surface 16 of substrate 14. In these embodiments, structures 315 extend upward from lower boundary 311 of trenches 306 a distance of at least about three microns or greater.

Figure 13:
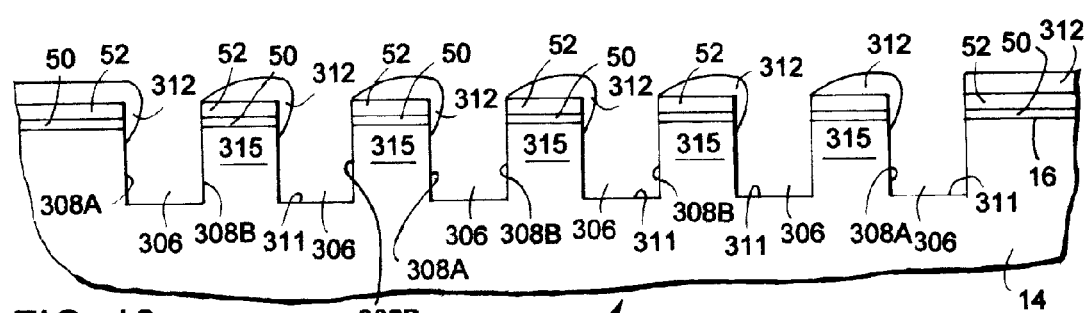
FIG. 13 is a cross-sectional view of the semiconductor structure of FIG. 12 at a later stage of manufacture.
Figure 14:
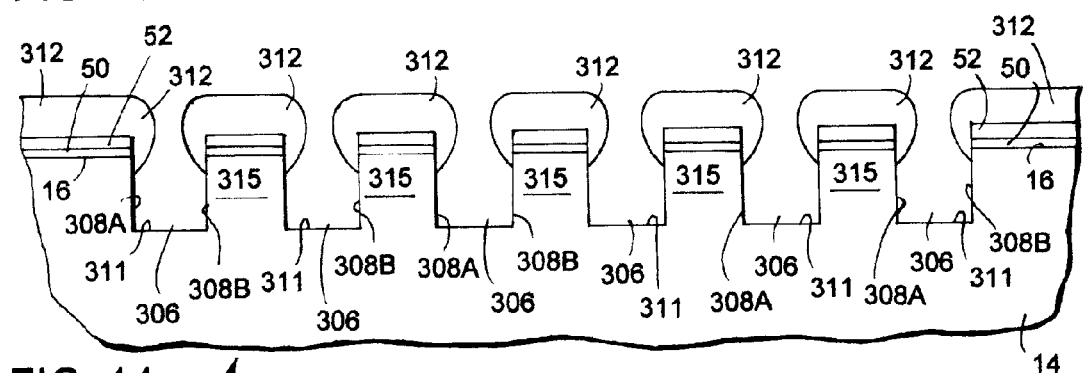
FIG. 14 is a cross-sectional view of the semiconductor structure of FIG. 13 at a later stage of manufacture.

Referring now to FIGS. 13 and 14, a capping material 312 is formed on dielectric layers 50 and 52 and on portions of sidewalls 308A and 308B near mouth 310. Capping material 312 may be deposited, grown, spun-on, or the like.

By way of example, barrier capping material 312 is a dielectric material that is non-conformally deposited using, for example, evaporation or sputtering. Suitable dielectric materials for capping material 312 include oxide, nitride, or the like. Capping material 312 is deposited onto substrate 14 at an angle while spinning or rotating substrate 14 in a deposition chamber. In other words, in this example, capping material 312 is formed using angled non-conformal deposition, for example evaporation or sputtering, of a dielectric material while rotating structure 300. Thus, capping material 312 is formed on sidewalls 308A and 308B, respectively, near the mouth of trenches 306. The angle of deposition of material 312 is not perpendicular to surface 16 of substrate 14, otherwise material 312 would only be evaporated over the top surface of silicon nitride layer 52 and in the bottom portions of trenches 306 and not on sidewalls 308A and 308B. FIG. 13 shows semiconductor structure 300 at an early stage in the angled deposition, where non-conformal material 312 has only been deposited on sidewall 308A. As structure 300 rotates, non-conformal dielectric material 312 will deposit on portions of all sides of structure 315, as shown in FIG. 14. Dielectric material 312 formed at the upper portions of structure 315 as shown in FIGS. 13 and 14 forms a "mushroom cap" structure that permits the selective removal of silicon of silicon structure 315 in a subsequent etching operation such as the etching operation described with reference to FIG. 15.

As may be appreciated, subsequent capping of trenches 306, such as is described with reference to FIG. 17, may be facilitated by the formation of material 312 which reduces the width or lateral dimension of mouths 310. In other words, by forming material 312 over the structures that comprise structure 315 and layers 50 and 52, the distance between materials 312 on structures 315 is substantially smaller, or less than, the distance between the lower portions of structures 315, and this may facilitate capping and reduce the overall dielectric constant of the resulting dielectric platform 330 (FIG. 18). In some embodiments, the distance between the materials 312 on structures 315 is about one micron or less.

Figure 15:
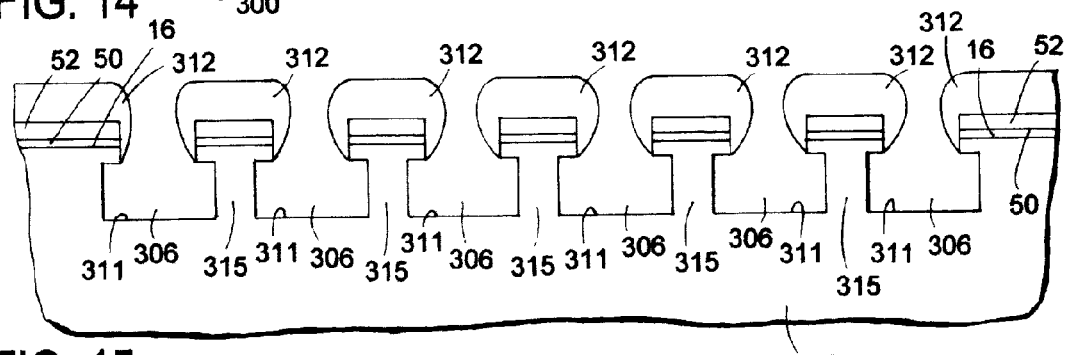
FIG. 15 is a cross-sectional view of the semiconductor structure of FIG. 14 at a later stage of manufacture.

Referring now to FIG. 15, portions of substrate 14 exposed by trenches 306 are removed using, for example, a dry etch to increase the width of trenches 306 and decrease the width of structures 315 and/or increase the depth of trenches 306. As is discussed above, the formation of dielectric material 312 at the upper portions of structure 315 as shown in FIGS. 13 and 14 permits the selective removal of portions of silicon structure 315.

Figure 16:
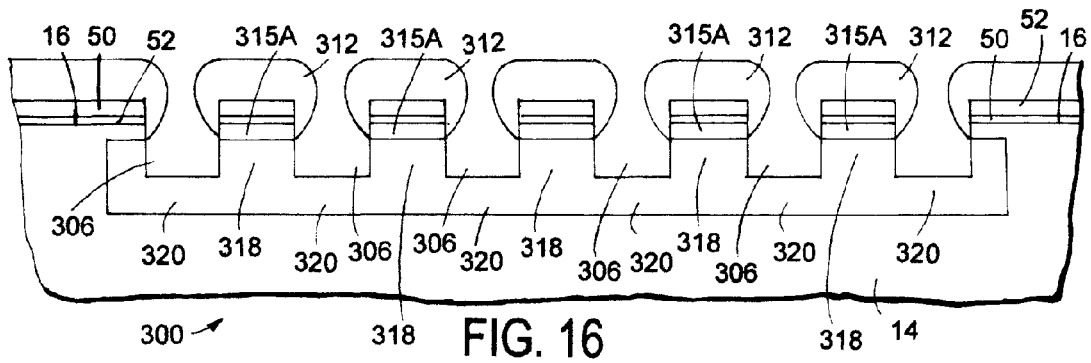
FIG. 16 is a cross-sectional view of the semiconductor structure of FIG. 15 at a later stage of manufacture.

Referring now to FIG. 16, the silicon adjacent trenches 306 is converted to silicon dioxide using, for example, a thermal oxidation technique. In some embodiments, structures 315 are completely converted to oxide and become oxide structures 318 and the portions of silicon substrate 14 adjacent the lower portion of trenches 306 become oxide layer 320. However, portions 315A of structures 315 (FIG. 15) may remain as silicon because they are protected by capping material 312 during the oxidation process. Although all of the silicon between the exposed sidewalls of structures 315 (FIG. 15) is shown as being converted to silicon dioxide in FIG. 16, this is not a limitation of the present invention. In other embodiments, not all of the silicon between the exposed sidewalls of structures 315 is converted to silicon dioxide.

Figure 17:
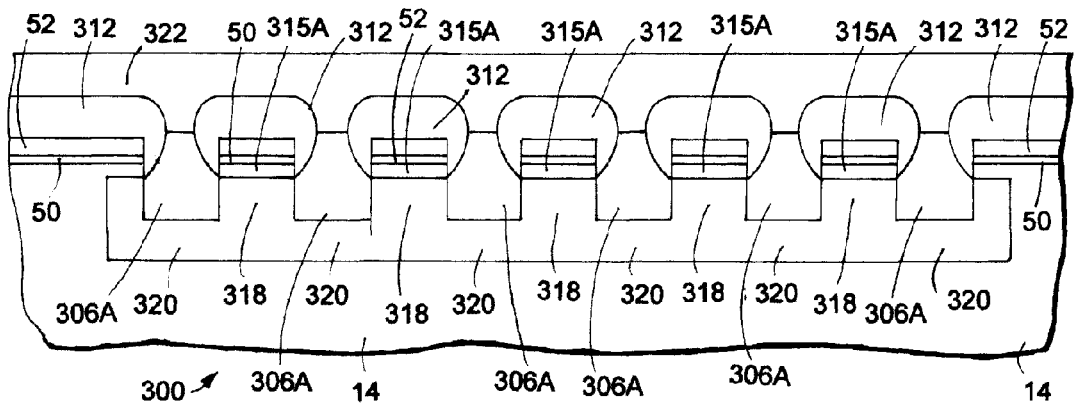
FIG. 17 is a cross-sectional view of the semiconductor structure of FIG. 16 at a later stage of manufacture.

Referring now to FIG. 17, a capping structure 322 is formed over capping materials 312. In some embodiments, capping structure 322 may comprise silicon dioxide and may be formed by low temperature chemical vapor deposition (CVD). Other suitable materials for capping structure 322 include silicon nitride, phosphosilicate glass (PSG), borophosphosilicate glass (BPSG), an oxide formed using tetraethylorthosilicate (TEOS), or the like. Capping structure 322 may have a thickness ranging from about 1000 Angstroms to about 4 microns. During formation of capping structure 322, the material of the capping structure may enter a portion of trench 306 (FIG. 16), that is the material of capping structure 322 may enter into the openings between capping material 312, but not fill trench 306 (FIG. 16) due in part to the relatively small size of the openings between capping materials 312, thereby forming a capped or sealed trench 306A. In another embodiment, capping structure 322 may partially or completely fill trenches 306. Capping structure 322 is planarized using, for example, a CMP technique. Capping structure 322 in combination with oxides 318 and 320, portions 315A, layers 50 and 52 above oxides 318 and 320, and capping materials 312 above oxides 318 and 320 together form dielectric Platform (DP) 330 shown in FIG. 18.

Referring now to FIG. 18, portions of capping structure 322, capping material 312, silicon nitride layer 52 and silicon dioxide layer 50 in active regions 20 and 21 are removed. Active and passive semiconductor devices may be formed in the portions of substrate 14 adjacent DP 330. In addition, active or passive circuit elements may be formed on DP 330.

A passive circuit element 324 is formed on DP 330 and FETS 101 and 102 may be formed from the portions of substrate 14 adjacent DP 330. FETS 101 and 102 have been described with reference to FIG. 1. Other types of devices that may be formed in active regions 20 and 21 include bipolar junction transistors, junction field effect transistors, insulated gate bipolar junction transistors, diodes, thyristors, passive devices, or the like.

Referring back to FIGS. 13 and 14, although barrier capping material 312 has been described above as an oxide or nitride material in some embodiments, this is not a limitation of the present invention. In other embodiments, capping material 312 may be a semiconductor material such as, for example, polysilicon, or an amorphous or single crystal silicon. The semiconductor material 312 may be formed using an angled evaporation process, wherein capping material 312 is deposited onto substrate 14 at an angle while spinning or rotating substrate 14. As was described above, the angle of deposition of material 312 is not perpendicular, or non-perpendicular, to surface 16 of substrate 14, otherwise material 312 would only be evaporated over the top surface of silicon nitride layer 52 and in the bottom portions of trenches 306 and not on sidewalls 308A and 308B. In other words, non-conformal semiconductor material 312 is formed on upper portions of structures 315 using an angled deposition, wherein the angle of deposition of material 312 is non-perpendicular to upper surface 16 of substrate 14.

Material 312 formed at the upper portions of structure 315 as shown in FIGS. 13 and 14 forms a "mushroom cap" structure. In embodiments where material 312 is a semiconductor material such as polysilicon, after the formation of polysilicon material 312, a thermal oxidation process may be used to convert the silicon adjacent trenches 306 to silicon dioxide similar to what was described above with reference to FIG. 16. However in these embodiments, the polysilicon material 312 is also converted to silicon dioxide. As is discussed above, about 2.2 units of thermal oxide may be formed from about one unit of silicon. As a result, the formation of silicon dioxide material 312 during this thermal oxidation process has the effect of further decreasing the spacing or openings between materials 312 during the thermal oxidation process. Thus, subsequent capping of trench 306 using capping structure 322 (FIG. 17) may be facilitated by the use of a semiconductor material for capping material 312 that will experience a volume expansion as part of a subsequent thermal oxidation process to further reduce the openings between materials 312. Accordingly, the thickness of capping structure or capping layer 322 may be relatively less in these embodiments.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high Q, and enable relatively higher frequency of operation or relatively higher breakdown voltages of any devices formed using, or in conjunction with, a structure that includes the disclosed dielectric platform. In addition, the disclosed dielectric platform and the methods for making the dielectric platform may reduce stress that may be imparted to regions adjacent to the dielectric platform compared to other techniques and structures.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A semiconductor structure, comprising:
a semiconductor material having a first boundary and a second boundary, wherein the first boundary is parallel to, or substantially parallel to, the second boundary;
a dielectric region, wherein at least a first portion of the dielectric region extends a distance of at least about one micron or greater from the first boundary of the semiconductor material toward the second boundary of the semiconductor material;
wherein the first portion of the dielectric region comprises a first protrusion and a second protrusion spaced apart from the first protrusion;
wherein the first protrusion has a first portion and a second portion and the second protrusion has a first portion and a second portion; and
a capping material formed on the first protrusion and the second protrusion;
wherein the first portion of the first protrusion is spaced apart from the first portion of the second protrusion by a first distance external to the capping material, the second portion of the first protrusion is spaced apart from the second portion of the second protrusion by a second distance external to the capping material, the second distance is substantially less than the first distance, and the first distance is more than about one hundred fifty percent (150%) of the second distance.

2. The semiconductor structure of claim 1, wherein the first portion of the dielectric region is embedded in the semiconductor material.

3. The semiconductor structure of claim 1, further comprising at least one void between the first protrusion and the second protrusion.

4. The semiconductor structure of claim 3, further comprising a dielectric layer over the at least one void and the first and second protrusions.

5. The semiconductor structure of claim 1, wherein a width of the first portion of the first protrusion is substantially less than a width of the second portion of the first protrusion.

6. The semiconductor structure of claim 5, wherein the width of the second portion of the first protrusion is more than about two times (2×) greater than the width of the first portion of the first protrusion.

7. The semiconductor structure of claim 1, wherein dielectric region has a first boundary that is parallel to, or substantially parallel to the first boundary of the semiconductor material.

8. The semiconductor structure of claim 1, wherein the first distance is about 1.5 microns and the second distance is about one micron, a height of the first protrusion is about one micron or greater, and a height of the second protrusion is about one micron or greater.

9. The semiconductor structure of claim 1, wherein the semiconductor material comprises silicon, the first protrusion comprises silicon dioxide, and the second protrusion comprises silicon dioxide.

10. The semiconductor structure of claim 1, further comprising an electrically conductive material, wherein at least a portion of the electrically conductive material is over the dielectric region.

11. The semiconductor structure of claim 10, wherein the electrically conductive material comprises aluminum, copper, or doped polycrystalline silicon.

12. The semiconductor structure of claim 1, wherein the first protrusion is a pillar.

13. The semiconductor structure of claim 1, wherein the first protrusion is an elongated wall and further comprising a first void and a second void isolated from the first void by the elongated wall.

14. The semiconductor structure of claim 1, wherein a width of the dielectric region is at least about three microns or greater.

15. The semiconductor structure of claim 1, further comprising a void and a dielectric layer abutting the void, wherein at least a portion of a boundary of the dielectric layer is perpendicular to, or substantially perpendicular to, the first boundary of the semiconductor material and is non-parallel, or substantially non-parallel to, a sidewall of the first protrusion.

16. The semiconductor structure of claim 1, wherein the dielectric region surrounds at least a portion of the semiconductor material.

17. The semiconductor structure of claim 1, wherein at least a portion of an active device is in the semiconductor material.

18. The semiconductor structure of claim 17, wherein the active device has a first doped region in the semiconductor material.

19. The semiconductor structure of claim 1, further comprising an electrically conductive material over the dielectric region, wherein at least a portion of the dielectric region is between at least a portion of the electrically conductive material and at least a portion of the semiconductor material to reduce capacitance between the electrically conductive material and the semiconductor material.

20. The semiconductor structure of claim 1, wherein a lower boundary of the dielectric region is at least about micron or greater from the first boundary of the semiconductor material and wherein the first protrusion extends a distance of at least about one micron from the lower boundary of the dielectric region.

* * * * *